(12) United States Patent
Sheahan

(10) Patent No.: US 10,248,083 B2
(45) Date of Patent: Apr. 2, 2019

(54) REFERENCE TIME GENERATOR

(71) Applicant: Benjamin J. Sheahan, Plano, TX (US)

(72) Inventor: Benjamin J. Sheahan, Plano, TX (US)

( * ) Notice: Subject to any disclaimer, the term of this patent is extended or adjusted under 35 U.S.C. 154(b) by 41 days.

(21) Appl. No.: 15/673,399

(22) Filed: Aug. 9, 2017

(65) Prior Publication Data

US 2017/0357218 A1   Dec. 14, 2017

Related U.S. Application Data

(63) Continuation-in-part of application No. 14/879,965, filed on Oct. 9, 2015, now Pat. No. 9,768,814.

(51) Int. Cl.

| | |
|---|---|
| *G04F 5/14* | (2006.01) |
| *G06F 1/04* | (2006.01) |
| *G04G 7/00* | (2006.01) |
| *G04R 20/02* | (2013.01) |
| *G04R 20/08* | (2013.01) |
| *H03M 1/00* | (2006.01) |
| *H04B 1/38* | (2015.01) |
| *H04B 10/079* | (2013.01) |
| *H04L 7/00* | (2006.01) |
| *H03L 7/00* | (2006.01) |
| *H03L 7/26* | (2006.01) |
| *H04L 1/00* | (2006.01) |

(52) U.S. Cl.
CPC ............ *G04F 5/14* (2013.01); *G04G 7/02* (2013.01); *G04R 20/02* (2013.01); *G04R 20/08* (2013.01); *H03L 7/00* (2013.01); *H03L 7/26* (2013.01); *H03M 1/004* (2013.01); *H04B 1/38* (2013.01); *H04B 10/07953* (2013.01); *H04L 7/00* (2013.01); *H04L 1/0054* (2013.01)

(58) Field of Classification Search
CPC ............................ G04F 5/14; G06F 1/04–1/12
See application file for complete search history.

(56) References Cited

U.S. PATENT DOCUMENTS

| | | | |
|---|---|---|---|
| 4,644,498 A * | 2/1987 | Bedard | ............... G06F 11/187 327/292 |
| 5,146,184 A | 9/1992 | Cutler | |
| 5,642,069 A * | 6/1997 | Waite | ............... G06F 11/0751 327/18 |
| 6,934,306 B1 * | 8/2005 | Park | .................. H04B 17/364 370/216 |
| 7,249,272 B1 * | 7/2007 | Wardrop | ............... H04J 3/0644 709/237 |
| 2014/0325250 A1 * | 10/2014 | Foster | .................... G06F 1/12 713/400 |

* cited by examiner

*Primary Examiner* — Dean O Takaoka
*Assistant Examiner* — Alan Wong
(74) *Attorney, Agent, or Firm* — Law Office of Mark A. Thomas

(57) ABSTRACT

A reference time generator including a first clock source including a reference synthesizer and cesium atomic clock configured to produce a cesium reference signal and a cesium QOT metric, a second clock source including a reference synthesizer and rubidium atomic clock configured to produce a rubidium reference signal and a rubidium QOT metric, and a circuit for selecting from the clock sources one reference signal based on the best QOT metric.

19 Claims, 3 Drawing Sheets

REFERENCE TIME GENERATOR

CROSS-REFERENCE TO RELATED APPLICATION(S)

This application is a continuation-in-part of, and claims the benefit of, U.S. patent application Ser. No. 14/879,965, filed Oct. 9, 2015, which is a continuation of, and claims the benefit of, U.S. patent application Ser. No. 13/200,075, filed Sep. 16, 2011, and further claims the benefit of U.S. Provisional Patent Application No. 61/403,480, filed Sep. 16, 2010, U.S. Provisional Patent Application No. 61/403,481, filed Sep. 16, 2010, U.S. Provisional Patent Application No. 61/403,482, filed Sep. 16, 2010, and U.S. Provisional Patent Application No. 61/403,483, filed Sep. 16, 2010. All prior applications are incorporated herein by reference in their entireties.

FIELD OF INVENTION

A reference time generator is disclosed, more specifically, a defined absolute reference time stamp ("DARTS") is used to enable a reference time generator selecting between different clock sources.

BACKGROUND

Accurate timekeeping has proven to be useful for many modern technologies. For example, the Global Positioning System (GPS), various computing devices and telecommunications networks all rely on accurate clocks. Compared to prior clocking devices, atomic clocks provide highly accurate timekeeping. The first atomic clock was an ammonia maser device built in 1949 at the U.S. National Bureau of Standards, now known as the National Institute of Standards and Technology (NIST). As a reflection of the importance of accurate timekeeping to modern commerce, NIST is an agency within the U.S. Department of Commerce.

Atomic clocks rely photons emitted by an electron transition from a higher energy level to a lower energy level as constrained by the laws of physics in general, and the laws of quantum mechanics in specific. Atomic clocks have been built based on the particularly precise "hyperfine" transitions often associated with the elements cesium, rubidium and hydrogen. For example, NIST uses the NIST-F1 atomic clock as one of the national primary time and frequency standards of the United States. The NIST-F1 is a type of atomic clock known as a cesium fountain clock, located at NIST facilities in Boulder, Colo., and serves as the United States' primary time and frequency standard. While the NIST-F1 is highly accurate, it is not a perfect timekeeping device as all known timekeeping devices are imperfect.

SUMMARY

In some embodiments, a defined absolute reference time stamp ("DARTS") is used to enable a reference time generator selecting between different clock sources.

These general and specific aspects may be implemented using a digital hardware, corresponding software or a combination of hardware and software. Other features will be apparent from the description, drawings and claims.

DRAWINGS

The figures depict embodiments for purposes of illustration only. One skilled in the art will readily recognize from the following description that alternative embodiments of the structures illustrated herein may be employed without departing from the principles described herein, wherein.

DETAILED DESCRIPTION

The following description and drawings are illustrative and are not to be construed as limiting. Numerous specific details are described to provide a thorough understanding of the disclosure. However, in certain instances, well known or conventional details are not described in order to avoid obscuring the description.

Reference in this specification to "one embodiment," "an embodiment," "some embodiments," or the like, means that a particular feature, structure, characteristic, advantage, or benefit described in connection with the embodiment is included in at least one disclosed embodiment, but may not be exhibited by other embodiments. The appearances of the phrase "in one embodiment" in various places in the specification are not necessarily all referring to the same embodiment, nor are separate or alternative embodiments mutually exclusive of other embodiments. Similarly, various requirements are described which may be requirements for some embodiments but not for other embodiments. The specification and drawings are to be regarded in an illustrative sense rather than a restrictive sense. Various modifications may be made thereto without departing from the scope as set forth in the claims.

In some embodiments, the reference time generator, as described in detail herein, employs multiple clock sources, each having a certain degree of accuracy and its own corresponding timing imperfections. A new quality of time ("QOT") metric is described herein that the reference time generator associates with each clock source. The QOT metric is used to select the most accurate clock source available at any given point in time to provide a reference time. For example, while cesium atomic clocks and rubidium atomic clocks are both highly accurate, in some embodiments when initially turned on, the rubidium clock may be more accurate over the short term, while the cesium clock may be more accurate over the long term. The QOT metric enables the reference time generator to select the most accurate atomic clock available at any given point in time to produce reference time that is more accurate than presently available.

Figure 1:
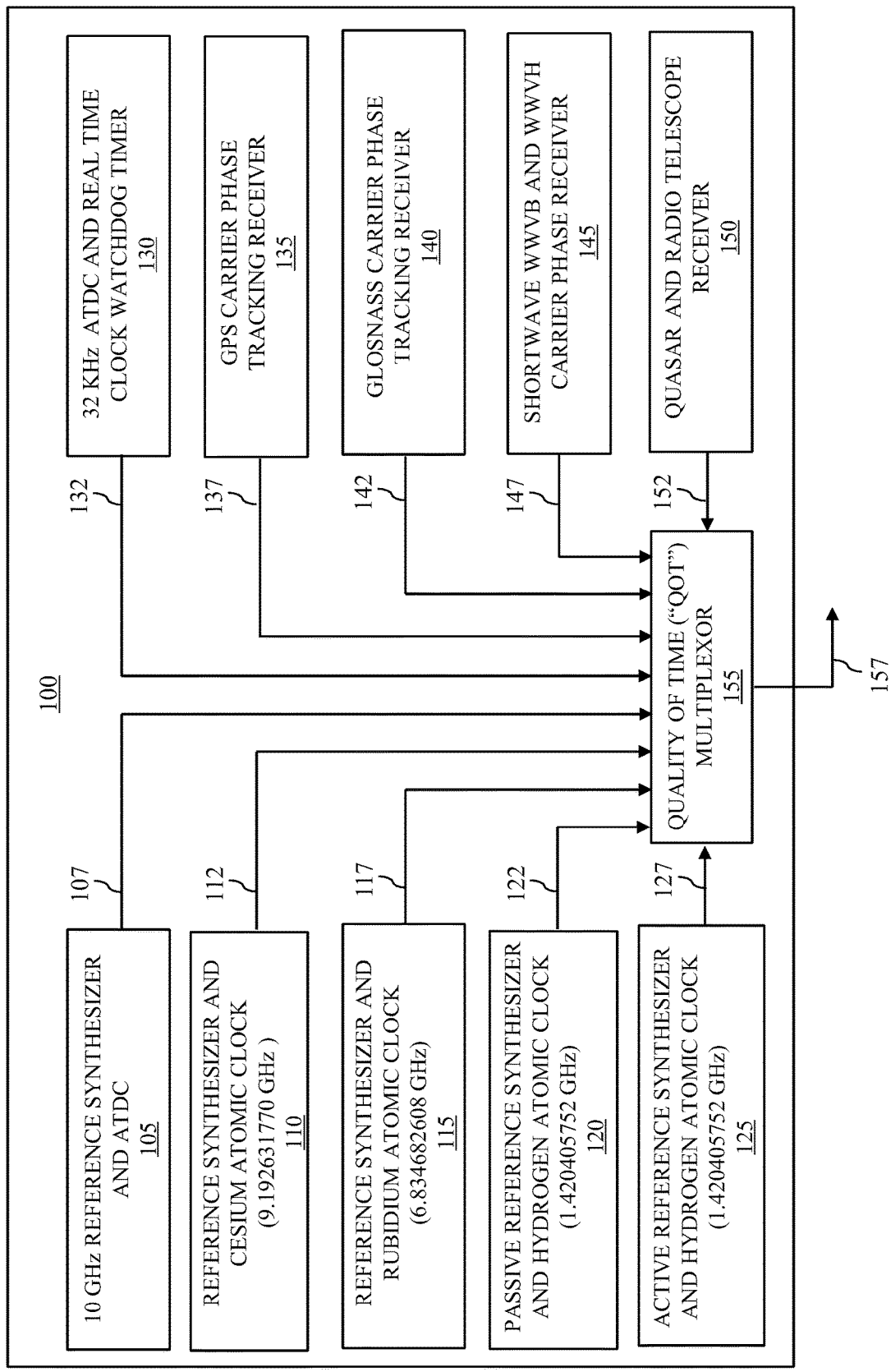
FIG. 1 is a block diagram of a reference time generator, according to some embodiments.

Referring to FIG. 1, a block diagram of a reference time generator 100, according to some embodiments, is shown. For description and illustration purposes, embodiments of a: 1. defined absolute reference time stamp ("DARTS"); 2. digital to analog and time converter ("DATC"); 3. analog and time to digital converter ("ATDC"); 4. Sheahan non-linear time-varying, analog and digital control system; and 5. Sheahan Communication Channel are described in detail in parent patent applications including U.S. patent application Ser. No. 14/879,965, filed Oct. 9, 2015, incorporated herein by reference in its entirety. Some embodiments employ a DARTS for conversion between the digital and analog domains to enable improved reference time generation. In some embodiments, the reference time generator 100 includes a variety of clock sources, but is not limited to any particular clock source or collection of clock sources. In some embodiments, the reference time generator 100 includes a 10 gigahertz (GHz) reference synthesizer and ATDC 105, a reference synthesizer and cesium atomic clock 110 (nominally running at 9.192631770 GHz according to *Fundamentals of Time and Frequency* (2002) by Michael A. Lombardi at NIST, hereby incorporated by reference), a reference synthesizer and rubidium atomic clock 115 (nominally running at 6.834682608 GHz according to *Fundamentals of Time and Frequency* (2002)), a passive reference synthesizer and hydrogen atomic clock 120 (nominally running at 1.420405752 GHz according to *Fundamentals of Time and Frequency* (2002)), an active reference synthesizer and hydrogen atomic clock 125 (nominally running at 1.420405752 GHz according to *Fundamentals of Time and Frequency* (2002)), a 32 kilohertz (KHz) ATDC and real-time clock watchdog timer 130, a GPS carrier phase tracking receiver 135, a Global Navigation Satellite System (Glosnass) carrier phase tracking receiver 140, a shortwave WWVB (from a NIST transmitter in Colorado) and WWVH (from a NIST transmitter in Hawaii) carrier phase receiver 145, and a quasar and radio telescope receiver 150.

In some embodiments, the 10 gigahertz (GHz) reference synthesizer and ATDC 105 is configured to produce a 10 GHZ reference signal and associated QOT metric 107 for that signal representing an error ratio between the desired signal and the actual signal produced. In some embodiments, the QOT metric takes the form of a signal to noise ratio (SNR) normalized for comparison with QOT metrics from other clock sources. In some embodiments, the reference synthesizer and cesium atomic clock 110 is configured to produce a 9.192631770 GHz reference signal and associated QOT metric 112 for that signal generally representing an error ratio between the desired signal and the actual signal produced. Note that for convenience, each reference signal may be denoted herein by an identifying characteristic of the device that produced it, e.g., in this case the reference signal is also identified as the cesium reference signal and the QOT metric is also identified as the cesium QOT metric. In some embodiments, the reference synthesizer and rubidium atomic clock 115 is configured to produce a 6.834682608 GHz reference signal and associated QOT metric 117 for that signal generally representing an error ratio between the desired signal and the actual signal produced. In some embodiments, the passive reference synthesizer and hydrogen atomic clock 120 is configured to produce a 6.834682608 GHz reference signal and associated QOT metric 122 for that signal generally representing an error ratio between the desired signal and the actual signal produced. In some embodiments, the active reference synthesizer and hydrogen atomic clock 125 is configured to produce a 6.834682608 GHz reference signal and associated QOT metric 117 for that signal generally representing an error ratio between the desired signal and the actual signal produced. In some embodiments, the 32 KHz ATDC and real-time clock watchdog timer 130 is configured to produce a 32 KHz reference signal and associated QOT metric 132 for that signal generally representing an error ratio between the desired signal and the actual signal produced. In some embodiments, the GPS carrier phase tracking receiver 135 is configured to produce a reference signal and associated QOT metric 137 for that signal generally representing an error ratio between the desired signal and the actual signal produced. In some embodiments, the Glosnass carrier phase tracking receiver 140 is configured to produce a reference signal and associated QOT metric 142 for that signal generally representing an error ratio between the desired signal and the actual signal produced. In some embodiments, the shortwave WWVB and WWVH carrier phase receiver 145 is configured to produce a reference signal and associated QOT metric 147 for that signal generally representing an error ratio between the desired signal and the actual signal produced. In some embodiments, the quasar and radio telescope receiver 150 is configured to produce a reference signal and associated QOT metric 152 for that signal generally representing an error ratio between the desired signal and the actual signal produced.

The reference time generator 100 further includes a QOT multiplexor 155 that receives the reference signal and associated QOT metric 107, 112, 117, 122, 127, 132, 137, 142, 147 and 152. The QOT multiplexor 155 periodically compares each of the reference signal and associated QOT metric 107, 112, 117, 122, 127, 132, 137, 142, 147 and 152 against each other to determine the lowest QOT metric at a given point in time to select the reference signal having the lowest QOT metric, representing the best available clock signal. The best available clock signal is output as the reference time 157. In some embodiments, the best available clock signal has the least noise, such as jitter. For example, if the reference synthesizer and cesium atomic clock 110 is turned on at the same time as the reference synthesizer and rubidium atomic clock 115, it may take many minutes for the reference synthesizer and cesium atomic clock to reach a better QOT metric than the reference synthesizer and rubidium atomic clock 115. The QOT multiplexor will select the reference synthesizer and rubidium atomic clock 115 until its QOT is less desirable than that of the reference synthesizer and cesium atomic clock 110.

The reference clock generator 100 is very flexible as to its selected source of time and in some embodiments, having 16 different sources with Gaussian error source, yields a 4 times improvement in accuracy. Because of differing times to reach stable operation, in practice, in some embodiments, the reference clock generator 100 selects in sequential order the 10 gigahertz (GHz) reference synthesizer and ATDC 105, then sequentially at least one of the passive reference synthesizer and hydrogen atomic clock 120 and the active reference synthesizer and hydrogen atomic clock 125, then the reference synthesizer and rubidium atomic clock 115, then the reference synthesizer and cesium atomic clock 110.

One advantage to improving reference time accuracy is that it enables an even more accurate DARTS to be generated than if only a single clock source were used. A more accurate DARTS improves timing for all DARTS applications, such as those reviewed in U.S. patent application Ser. No. 14/879,965, filed Oct. 9, 2015 by Sheahan. As envisioned herein, in some embodiments, the reference time 157 enables an 80-bit DARTS. However, the DARTS is not limited to 80 bits and may be comprised of more or less than 80 bits. For example, in some embodiments the reference time 157 enables a DARTS of more than 80 bits.

There are many other advantages to improving reference time accuracy. For example, improved reference time accuracy enabled herein is envisioned to reduce GPS location error and reduce optical fiber packet timing errors to increase bandwidth, maintain integrity to minimize the need for buffering, and improve battery with better synchronization.

Figure 2:
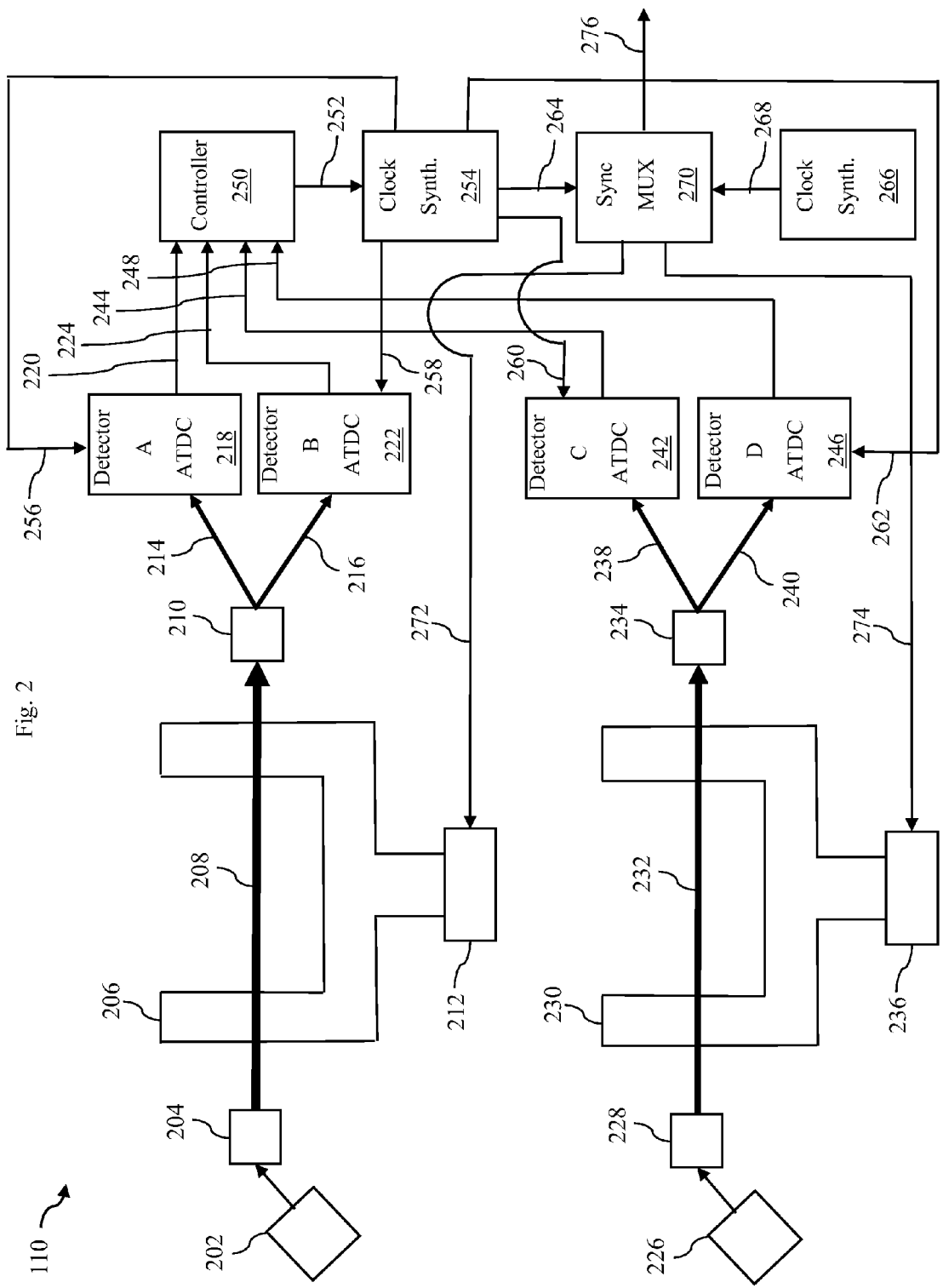
FIG. 2 is a block diagram of a reference synthesizer and cesium atomic clock.

Referring to FIG. 2, a block diagram of a reference synthesizer and cesium atomic clock 110, according to some embodiments, is shown. In some embodiments, some aspects of the reference synthesizer and cesium atomic clock 110 are disclosed in U.S. Pat. No. 5,146,184 to Cutler, hereby incorporated by reference in its entirety. The reference synthesizer and cesium atomic clock 110 employs a cesium ion source 202. Cesium ions generated by the cesium ion source 202 are transformed into cesium ions by a cesium ion generator 204 and transmitted through a cesium beam cavity 206 as a cesium ion beam 208 to a magnetic state selector 210. A power amp 212 is used to excite the cesium ions in the cesium ion beam 208. The magnetic state selector 210 separates a selected cesium ion stream 214, having cesium ions with a desired magnetic state that exhibited the desired cesium hyperfine transition, from a non-selected cesium ion stream 216, having cesium ions without a desired magnetic state that exhibited the desired cesium hyperfine transition. The magnetic state selector 210 magnetically directs the selected cesium ion stream 214 to Detector A ATDC 218 which senses the cesium ions and associates such events with a DARTS that it transmits on bus 220. Similarly, the magnetic state selector 210 magnetically directs the non-selected cesium ion stream 216 to Detector B ATDC 222 which senses those cesium ions and associates such events with a DARTS that it transmits on bus 224.

The reference synthesizer and cesium atomic clock 110 described above has a first cesium ion clock source. In some embodiments, the reference synthesizer and cesium atomic clock 110 includes a second cesium ion clock source. Because no two cesium atom clock sources are identical, having first and second cesium ion clock sources enables the best available signal to be selected between the first and second cesium ion clock sources.

In some embodiments, the reference synthesizer and cesium atomic clock 110 employs a cesium ion source 226. Cesium ions generated by the cesium ion source 226 are transformed into cesium ions by a cesium ion generator 228 and transmitted through a cesium beam cavity 230 as a cesium ion beam 232 to a magnetic state selector 234. A power amp 236 is used to excite the cesium ions in the cesium ion beam 232. The magnetic state selector 234 separates a selected cesium ion stream 238, having cesium ions with a desired magnetic state that exhibited the desired cesium hyperfine transition, from a non-selected cesium ion stream 240, having cesium ions without a desired magnetic state that exhibited the desired cesium hyperfine transition. The magnetic state selector 234 magnetically directs the selected cesium ion stream 238 to Detector C ATDC 242 which senses the cesium ions and associates such events with a DARTS that it transmits on bus 244. Similarly, the magnetic state selector 234 magnetically directs the non-selected cesium ion stream 240 to Detector D ATDC 246 which senses those cesium ions and associates such events with a DARTS that it transmits on bus 248.

A controller 250 receives and combines the sensor data from Detector A ATDC 218 via bus 220 and Detector B ATDC 222 via bus 224 to produce a first offset signal transmitted on bus 252 for the first cesium ion clock source to a clock synthesizer 254. The controller 250 also receives and compares the sensor data Detector C ATDC 242 via bus 244 and Detector D ATDC 246 via bus 248 to produce a second offset signal transmitted to a clock synthesizer 266 via another bus not shown because of space limitations. The clock synthesizer is produces a clocking signal transmitted on bus 256 to Detector A ATDC 218, bus 258 to Detector B ATDC 222, bus 260 to Detector C ATDC 242, and bus 262 to Detector D ATDC 246.

The clock synthesizer 254 transits the selected first clocking signal via bus 264 to a synchronous multiplexer (MUX) 270. The clock synthesizer 266 transits the selected second clocking signal via bus 268 to the synchronous MUX 270. The synchronous MUX 270 transmits a first feedback signal on bus 272 to the power amp 212 to minimize the jitter at the clock signal output used to sweep between two closely related frequencies approximately equidistant from the cesium resonance frequency which acts as a center frequency in the cesium beam cavity 206. Similarly, the synchronous MUX 270 transmits a second feedback signal on bus 274 to the power amp 236 to minimize the jitter at the clock signal output used to sweep between two closely related frequencies approximately equidistant from the cesium resonance frequency which acts as a center frequency in the cesium beam cavity 230. The synchronous MUX 270 selects the first clocking signal or the second clocking signal based on which has the better QOT and transmits a reference time 276.

Figure 3:
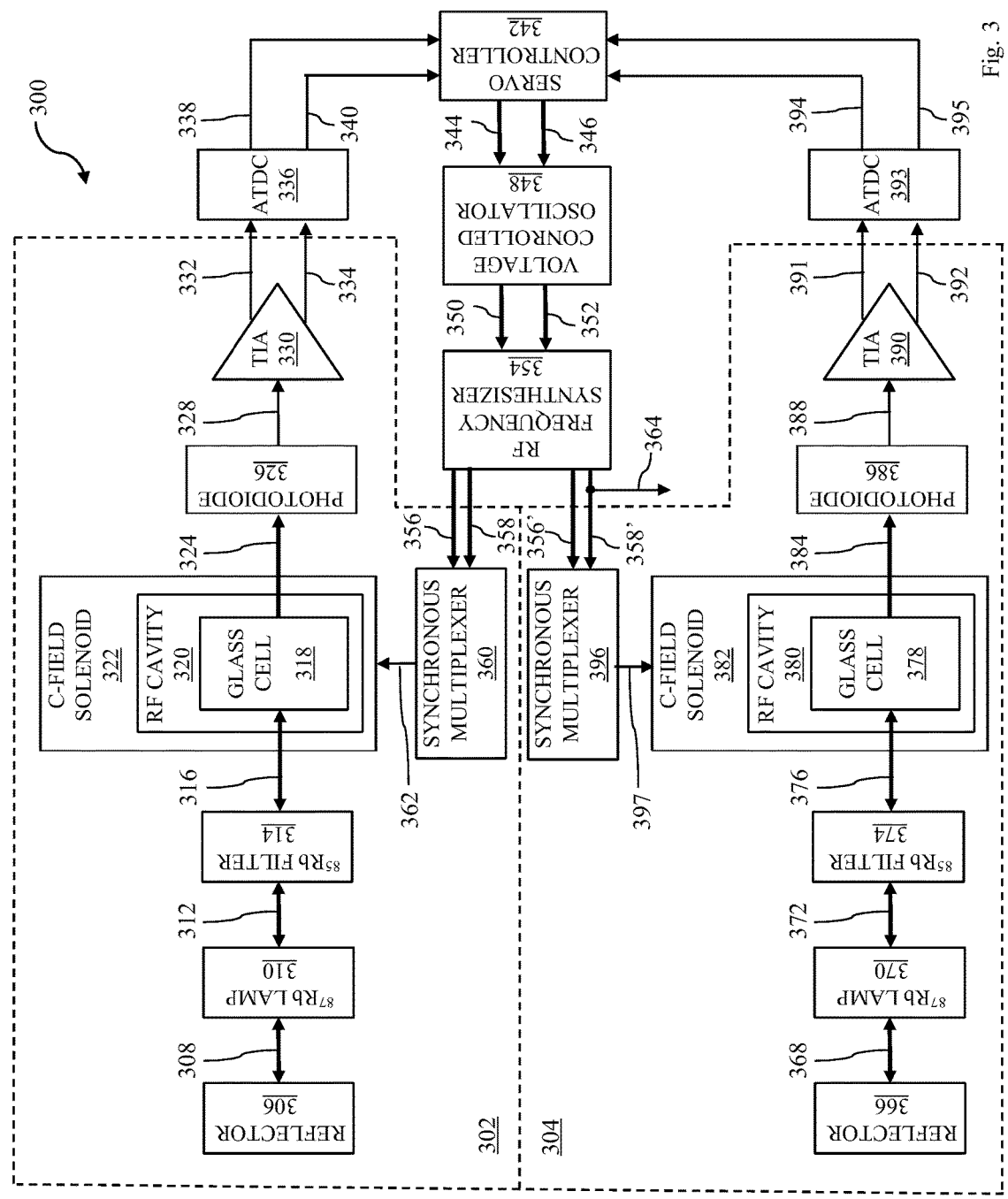
FIG. 3 is a block diagram of a reference synthesizer and rubidium atomic clock.

Referring to FIG. 3, a block diagram of a reference synthesizer and rubidium atomic clock 115, according to some embodiments, is shown. In general, rubidium standard clocks are prized for their low cost, small size and short-term stability in contrast to cesium clocks that tend to be far more expensive but exhibit greater long-term stability. The reference synthesizer and rubidium atomic clock 115 includes a reflector 306 for reflecting microwaves 308 at or near the resonant frequency of rubidium. The microwaves 308 are emitted by a $^{87}$Rb lamp 310. Note that $^{87}$Rb designates the rubidium 87 isotope, while $^{85}$Rb designates the rubidium 85 isotope. The $^{87}$Rb lamp 310 employs $^{87}$Rb because of its advantageous hyperfine transition. Microwaves 312, including a portion of reflected microwaves 308 are transmitted from the $^{87}$Rb lamp 310 through a $^{85}$Rb filter 314 as filtered microwaves 316 to a glass cell 318 within a radio frequency (RF) cavity 320 within a C-field solenoid 322. This causes the microwaves to be reduced, with the amount of reduction depending on how close to the resonant frequency of $^{87}$Rb the resultant microwaves are. The further away from the resonant frequency of $^{87}$Rb the resultant microwaves are the more photons are in the microwaves 324 sensed by a photodiode 326. Thus, the number of photons in the microwaves 324 sensed by a photodiode 326 are a QOT metric. The photodiode 326 transmits the QOT metric via bus 328 to a transimpedance amplifier (TIA amp) 330. The TIA amp 330 amplifies the QOT metric signal and transmits the QOT metric over bus 332 and its inverted version QOT-bar over bus 334 to an ATDC 336 which associates each sensed QOT metric with a DARTS.

The ATDC 336 transmits each sensed QOT metric with a DARTS over bus 338 and bus 340 to a servo controller 342. The servo controller 342 transmits and converts each sensed QOT metric with a DARTS to a feedback pulse and transmits that to a voltage controlled oscillator 348, which in turn transmits those signals to an RF frequency synthesizer 354. The RF frequency synthesizer 354 transmits modulated signals on bus 356 and duplicate bus 356'. The RF frequency synthesizer 354 also transmits unmodulated signals on bus 358 and duplicate bus 358'. A synchronous multiplexer 360 receives the modulated signals via bus 356 and unmodulated signals via bus 358 and provides an output 362 used to control the C-field solenoid 322.

Similarly, the reference synthesizer and rubidium atomic clock 115 includes a second reflector 366 for reflecting microwaves 368 at or near the resonant frequency of rubidium. The microwaves 368 are emitted by a $^{87}$Rb lamp 370. Microwaves 372, including a portion of reflected microwaves 368 are transmitted from the $^{87}$Rb lamp 370 through a $^{85}$Rb filter 374 as filtered microwaves 376 to a glass cell 378 within a radio frequency (RF) cavity 380 within a C-field solenoid 382. This causes the microwaves to be reduced, with the amount of reduction depending on how close to the resonant frequency of $^{87}$Rb the resultant microwaves are. The further away from the resonant frequency of $^{87}$Rb the resultant microwaves are the more photons are in the microwaves 384 sensed by a photodiode 386. Thus, the number of photons in the microwaves 384 sensed by a photodiode 386 are a QOT metric. The photodiode 386 transmits the QOT metric via bus 388 to a transimpedance amplifier (TIA amp) 390. The TIA amp 390 amplifies the QOT metric signal and transmits the QOT over bus 391 and its inverted version QOT-bar over bus 392 to an ATDC 393 which associates each sensed QOT metric with a DARTS.

The ATDC 393 transmits each sensed QOT metric with a DARTS over bus 394 and bus 395 to the servo controller 342. The servo controller 342 transmits and converts each sensed QOT metric with a DARTS to a feedback pulse and transmits that to the voltage controlled oscillator 348, which in turn transmits those signals to the RF frequency synthesizer 354. The RF frequency synthesizer 354 transmits modulated signals on bus 356 and duplicate bus 356'. The RF frequency synthesizer 354 also transmits unmodulated signals on bus 358 and duplicate bus 358', as described above. A synchronous multiplexer 396 receives the modulated signals via bus 356' and unmodulated signals via bus 358' and provides an output 397 used to control the C-field solenoid 382. The RF frequency synthesizer also drives the reference signal 364, which is used along with the corresponding QOT to select the reference signal when the QOT is the best available.

Some embodiments herein describe a reference time generator. The reference time generator includes a first clock source including a reference synthesizer and cesium atomic clock configured to produce a cesium reference signal and a cesium QOT metric, a second clock source including a reference synthesizer and rubidium atomic clock configured to produce a rubidium reference signal and a rubidium QOT metric, wherein the reference time generator selects a reference signal to transmit based on the best QOT metric.

Some embodiments herein describe a reference time generator. The reference time generator includes a first clock source including a reference synthesizer and cesium atomic clock configured to produce a cesium reference signal and a cesium QOT metric, a second clock source including a reference synthesizer and rubidium atomic clock configured to produce a rubidium reference signal and a rubidium QOT metric, wherein the reference time generator selects a reference signal to transmit based on the best QOT metric and the best QOT metric changes over time.

Some embodiments also include at least one of a passive reference synthesizer and hydrogen atomic clock configured to produce a passive hydrogen reference signal and a passive hydrogen QOT metric, an active reference synthesizer and hydrogen atomic clock configured to produce an active hydrogen reference signal and an active hydrogen QOT metric, a 32 kilohertz (KHz) ATDC and real-time clock watchdog timer configured to produce a watchdog reference signal and a watchdog QOT metric, a third clock source including a GPS carrier phase tracking receiver configured to produce a GPS reference signal and a GPS QOT metric, a Glosnass carrier phase tracking receiver configured to produce a Glosnass reference signal and a Glosnass QOT metric, a shortwave WWVB configured to produce a WWVB reference signal and a WWVB QOT metric, a third clock source including a shortwave WWVH configured to produce a WWVH reference signal and a WWVH QOT metric, and a quasar and radio telescope receiver configured to produce a quasar reference signal and a quasar QOT metric.

Some embodiments herein describe a reference time generator. The reference time generator includes a first clock source including a reference synthesizer and cesium atomic clock configured to produce a cesium reference signal and a cesium QOT metric, a second clock source including a reference synthesizer and rubidium atomic clock configured to produce a rubidium reference signal and a rubidium QOT metric, a third clock source including a passive reference synthesizer and hydrogen atomic clock configured to produce a passive hydrogen reference signal and a passive hydrogen QOT metric, a fourth clock source including an active reference synthesizer and hydrogen atomic clock configured to produce an active hydrogen reference signal and an active hydrogen QOT metric, a fifth clock source including a GPS carrier phase tracking receiver configured to produce a GPS reference signal and a GPS QOT metric, a sixth clock source including a Glosnass carrier phase tracking receiver configured to produce a Glosnass reference signal and a Glosnass QOT metric, a seventh clock source including a shortwave WWVB configured to produce a WWVB reference signal and a WWVB QOT metric, and an eighth clock source including a shortwave WWVH configured to produce a WWVH reference signal and a WWVH QOT metric, wherein the reference time generator selects a reference signal to transmit based on the best QOT metric and the best QOT metric changes over time.

It will be understood that various modifications can be made to the embodiments of the present disclosure herein without departing from the scope thereof. Therefore, the above description should not be construed as limiting the disclosure, but merely as embodiments thereof. Those skilled in the art will envision other modifications within the scope of the invention as defined by the claims appended hereto.

What is claimed is:

1. A reference time generator, comprising:
   a first clock source including a reference synthesizer and cesium atomic clock configured to produce a cesium reference signal and a cesium QOT metric;
   a second clock source including a reference synthesizer and rubidium atomic clock configured to produce a rubidium reference signal and a rubidium QOT metric,
   wherein the reference time generator selects a reference signal to transmit based on the best QOT metric.

2. The reference time generator of claim 1, further comprising:
   a third clock source including a passive reference synthesizer and hydrogen atomic clock configured to produce a passive hydrogen reference signal and a passive hydrogen QOT metric.

3. The reference time generator of claim 1, further comprising:
   a third clock source including an active reference synthesizer and hydrogen atomic clock configured to produce an active hydrogen reference signal and an active hydrogen QOT metric.

4. The reference time generator of claim 1, further comprising:
   a third clock source including a 32 kilohertz (KHz) ATDC and real-time clock watchdog timer configured to produce a watchdog reference signal and a watchdog QOT metric.

5. The reference time generator of claim 1, further comprising:
   a third clock source including a GPS carrier phase tracking receiver configured to produce a GPS reference signal and a GPS QOT metric.

6. The reference time generator of claim 1, further comprising:
a third clock source including a Glosnass carrier phase tracking receiver configured to produce a Glosnass reference signal and a Glosnass QOT metric.

7. The reference time generator of claim 1, further comprising:
a third clock source including a shortwave WWVB configured to produce a WWVB reference signal and a WWVB QOT metric.

8. The reference time generator of claim 1, further comprising:
a third clock source including a shortwave WWVH configured to produce a WWVH reference signal and a WWVH QOT metric.

9. The reference time generator of claim 1, further comprising:
a third clock source including a quasar and radio telescope receiver configured to produce a quasar reference signal and a quasar QOT metric.

10. A reference time generator, comprising:
a first clock source including a reference synthesizer and cesium atomic clock configured to produce a cesium reference signal and a cesium QOT metric;
a second clock source including a reference synthesizer and rubidium atomic clock configured to produce a rubidium reference signal and a rubidium QOT metric,
wherein the reference time generator selects a reference signal to transmit based on the best QOT metric and the best QOT metric changes over time.

11. The reference time generator of claim 10, further comprising: a third clock source including a passive reference synthesizer and hydrogen atomic clock configured to produce a passive hydrogen reference signal and a passive hydrogen QOT metric.

12. The reference time generator of claim 10, further comprising: a third clock source including an active reference synthesizer and hydrogen atomic clock configured to produce an active hydrogen reference signal and an active hydrogen QOT metric.

13. The reference time generator of claim 10, further comprising: a third clock source including a 32 kilohertz (KHz) ATDC and real-time clock watchdog timer configured to produce a watchdog reference signal and a watchdog QOT metric.

14. The reference time generator of claim 10, further comprising: a third clock source including a GPS carrier phase tracking receiver configured to produce a GPS reference signal and a GPS QOT metric.

15. The reference time generator of claim 10, further comprising: a third clock source including a Glosnass carrier phase tracking receiver configured to produce a Glosnass reference signal and a Glosnass QOT metric.

16. The reference time generator of claim 10, further comprising: a third clock source including a shortwave WWVB configured to produce a WWVB reference signal and a WWVB QOT metric.

17. The reference time generator of claim 10, further comprising: a third clock source including a shortwave WWVH configured to produce a WWVH reference signal and a WWVH QOT metric.

18. The reference time generator of claim 10, further comprising: a third clock source including a quasar and radio telescope receiver configured to produce a quasar reference signal and a quasar QOT metric.

19. A reference time generator, comprising:
a first clock source including a reference synthesizer and cesium atomic clock configured to produce a cesium reference signal and a cesium QOT metric;
a second clock source including a reference synthesizer and rubidium atomic clock configured to produce a rubidium reference signal and a rubidium QOT metric;
a third clock source including a passive reference synthesizer and hydrogen atomic clock configured to produce a passive hydrogen reference signal and a passive hydrogen QOT metric;
a fourth clock source including an active reference synthesizer and hydrogen atomic clock configured to produce an active hydrogen reference signal and an active hydrogen QOT metric;
a fifth clock source including a GPS carrier phase tracking receiver configured to produce a GPS reference signal and a GPS QOT metric;
a sixth clock source including a Glosnass carrier phase tracking receiver configured to produce a Glosnass reference signal and a Glosnass QOT metric;
a seventh clock source including a shortwave WWVB configured to produce a WWVB reference signal and a WWVB QOT metric; and
an eighth clock source including a shortwave WWVH configured to produce a WWVH reference signal and a WWVH QOT metric,
wherein the reference time generator selects a reference signal to transmit based on the best QOT metric and the best QOT metric changes over time.

* * * * *